US008803165B2

(12) United States Patent
Kamikawa

(10) Patent No.: US 8,803,165 B2
(45) Date of Patent: Aug. 12, 2014

(54) NITRIDE SEMICONDUCTOR LIGHT EMITTING DEVICE AND METHOD FOR MANUFACTURING NITRIDE SEMICONDUCTOR LIGHT EMITTING DEVICE

(75) Inventor: Takeshi Kamikawa, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 681 days.

(21) Appl. No.: 12/216,295

(22) Filed: Jul. 2, 2008

(65) Prior Publication Data

US 2009/0010293 A1        Jan. 8, 2009

(30) Foreign Application Priority Data

Jul. 3, 2007    (JP) ................. 2007-174748

(51) Int. Cl.
*H01L 27/15* (2006.01)
(52) U.S. Cl.
USPC ............... 257/85; 257/99; 257/632; 257/729; 257/E51.018
(58) Field of Classification Search
USPC ................... 257/99, 85, 632, 729, E51.018
See application file for complete search history.

(56) References Cited

U.S. PATENT DOCUMENTS

| 4,628,590 | A | * | 12/1986 | Udo et al. ........................ 438/6 |
| 7,053,413 | B2 | * | 5/2006 | D'Evelyn et al. ............... 257/79 |
| 7,072,374 | B2 | | 7/2006 | Matsumura |
| 7,338,827 | B2 | * | 3/2008 | Sugahara et al. ............... 438/41 |
| 2004/0161010 | A1 | | 8/2004 | Matsumura |
| 2006/0091417 | A1 | * | 5/2006 | Sugimoto et al. ............... 257/99 |
| 2007/0086496 | A1 | | 4/2007 | Tanaka et al. |
| 2007/0099324 | A1 | * | 5/2007 | Iino et al. ........................ 438/31 |

FOREIGN PATENT DOCUMENTS

| CN | 1503416 | 6/2004 |
| EP | 1 422 798 | 7/2006 |
| JP | 11-150301 | 6/1999 |
| JP | 2004-356273 | 12/2004 |
| JP | 2007-109885 | 4/2007 |

* cited by examiner

*Primary Examiner* — Dale E Page
(74) *Attorney, Agent, or Firm* — Harness, Dickey & Pierce, P.L.C.

(57) ABSTRACT

A nitride semiconductor light emitting device includes an n-type GaN substrate (101) that is a nitride semiconductor substrate, a nitride semiconductor layer including a p-type nitride semiconductor layer formed on the n-type GaN substrate (101). The p-type nitride semiconductor layer includes a p-type AlGaInN contact layer (108), a p-type AlGaInN cladding layer (107) under the p-type AlGaInN contact layer (108), and a p-type AlGaInN layer (106). A protection film (113) made of a silicon nitride film is formed above a current injection region formed in the p-type nitride semiconductor layer.

10 Claims, 8 Drawing Sheets

US 8,803,165 B2

NITRIDE SEMICONDUCTOR LIGHT EMITTING DEVICE AND METHOD FOR MANUFACTURING NITRIDE SEMICONDUCTOR LIGHT EMITTING DEVICE

This application is based on Japanese Patent Application No. 2007-174748 filed on Jul. 3, 2007, the contents of which are hereby incorporated by reference.

BACKGROUND OF THE INVENTION

1. Field of the Invention

The present invention relates to a nitride semiconductor light emitting device and a method for manufacturing the nitride semiconductor light emitting device.

2. Description of Related Art

A conventional method for manufacturing the nitride semiconductor laser device will be described with reference to FIGS. 10 and 11. FIG. 10 is a schematic drawing showing inside of a conventional nitride semiconductor laser device, and FIG. 11 is a drawing showing an external view of the conventional nitride semiconductor laser device.

In the conventional method for manufacturing the nitride semiconductor laser device, a nitride semiconductor laser chip 403 is soldered to a sub mount 402 as a heatsink with solder 406, and then the sub mount 402 with the soldered nitride semiconductor laser chip 403 is soldered onto a holding substrate (stem) 401 with solder (not shown). Then, a pin 405 provided to the holding substrate (stem) 401 is connected electrically to the nitride semiconductor laser chip 403 with a wire 404. Next, a work box is prepared, which is filled up with air having dew point controlled to be under −20 degrees centigrade by eliminating moisture (hereinafter referred to as dry air), for example. As shown in FIG. 11, the nitride semiconductor laser chip is sealed together with the dry air in the work box by using a cap 407 with a glass lens 407a that passes a laser beam. Thus, the nitride semiconductor laser device is manufactured. The nitride semiconductor laser device manufactured by the above-mentioned process is operated in the dry air.

In general, if the nitride semiconductor laser device is operated in dry air, it can work stably more than 3,000 hours. However, even if it is sealed in dry air, the seal may be insufficient, for example. In this case, the dry air may leak slightly so that atmospheric air (that contains moisture and is not controlled about its dew point) may enter inside the cap. If the atmospheric air enters inside the cap described above, there is observed a phenomenon that voltage increases rapidly after 100 to 1000 hours or so. In some elements the voltage increases more than 1 volt, and others may cause further deterioration resulting in stop of oscillation.

The same phenomenon as the case where the dry air leaks so that the atmospheric air enter inside the cap is observed in the case where the nitride semiconductor laser chip 403, which is not sealed by the cap 407 in dry air, is operated in the atmospheric air that contains moisture and is not controlled about its dew point (hereinafter referred to as an open air package). Such a phenomenon is unique to a nitride semiconductor laser device, which is not observed in case of a GaAs system laser element that has been put to practical use conventionally. Described above, there is a problem that voltage may increase resulting in a malfunction if the dry air leaks so that the atmospheric air enter inside the cap due to an excessive stress while the nitride semiconductor laser device is assembled or operated.

SUMMARY OF THE INVENTION

It is an object of the present invention to provide a nitride semiconductor light emitting device and a method for manufacturing the device, which enables a stable operation for a long period of time without causing an increase of voltage when the nitride semiconductor light emitting device is operated in the open air package.

A nitride semiconductor light emitting device according to a first aspect of the present invention includes a nitride semiconductor substrate and a nitride semiconductor layer having a p-type nitride semiconductor layer formed on the nitride semiconductor substrate. The nitride semiconductor layer has a current injection region into which current is injected, and a protection film made up of a silicon nitride film and/or a silicon nitride oxide film is formed above the current injection region.

The nitride semiconductor light emitting device according to this first aspect can prevent hydrogen molecules contained in moisture in atmosphere from reaching the current injection region even if the nitride semiconductor light emitting device is operated in the atmospheric air, because the protection film made up of the silicon nitride film and/or the silicon nitride oxide film is formed above the current injection region as described above. Thus, it is possible to prevent the current injection region from becoming to have a high resistance resulting in an increase of voltage in the nitride semiconductor light emitting device, which may occur when the hydrogen molecules pass through the current injection region or are diffused by the same. Accordingly, the nitride semiconductor light emitting device can work stably for a long period of time.

As to the nitride semiconductor light emitting device according to the first aspect described above, it is preferable that an electrode and/or an electrode pad be formed above the current injection region, and that the protection film be formed above the electrode and/or the electrode pad. According to this structure, penetration of hydrogen molecules contained in the atmospheric air can be prevented effectively since the protection film is formed above the electrode and/or the electrode pad. Thus, the increase of voltage in the nitride semiconductor light emitting device can be suppressed easily, so that the device can work stably for a long period of time.

As to the nitride semiconductor light emitting device according to the first aspect described above, the current injection region can have a ridge stripe structure.

A nitride semiconductor light emitting device according to a second aspect of the present invention includes a nitride semiconductor substrate and a nitride semiconductor layer having a p-type nitride semiconductor layer formed on the nitride semiconductor substrate, in which a protection film made up of a silicon nitride film and/or a silicon nitride oxide film is formed above the p-type nitride semiconductor layer.

The nitride semiconductor light emitting device according to the second aspect described above can prevent hydrogen molecules contained in moisture in atmosphere from reaching the p-type nitride semiconductor layer even if the nitride semiconductor light emitting device is operated in the atmospheric air, because the protection film made up of the silicon nitride film and/or the silicon nitride oxide film is formed above the p-type nitride semiconductor layer as described above. Thus, it is possible to prevent the p-type nitride semiconductor layer from becoming to have a high resistance resulting in an increase of voltage in the nitride semiconductor light emitting device, which may occur when the hydrogen molecules pass through the p-type nitride semiconductor layer or are diffused by the same. Accordingly, the nitride semiconductor light emitting device can work stably for a long period of time.

As to the nitride semiconductor light emitting device according to the first or the second aspect described above, it is preferable that a thickness of the silicon nitride film or the silicon nitride oxide film be 6 nanometers or larger. According to this structure, it is possible to prevent easily the hydrogen molecules contained in moisture in atmosphere from reaching the nitride semiconductor layer.

As to the nitride semiconductor light emitting device according to the first or the second aspect described above, it is preferable that the silicon nitride oxide film be expressed by a general formula $SiO_{1-x}N_x$, and a composition ratio of nitrogen x in the silicon nitride oxide film is 0.1 or more. According to this structure, it is possible to prevent easily the hydrogen molecules contained in moisture in atmosphere from reaching the nitride semiconductor layer.

A method for manufacturing a nitride semiconductor light emitting device according to a third aspect of the present invention includes the steps of forming a nitride semiconductor layer having a p-type nitride semiconductor layer on a nitride semiconductor substrate, forming a current injection region into which current is injected in the nitride semiconductor layer, and forming a protection film made up of a silicon nitride film and/or a silicon nitride oxide film above the current injection region.

Since the method for manufacturing a nitride semiconductor light emitting device of the third aspect described above includes the step of forming the protection film made up of a silicon nitride film and/or a silicon nitride oxide film above the current injection region, it is possible to prevent hydrogen molecules contained in moisture in atmosphere from reaching the current injection region even if the obtained nitride semiconductor light emitting device is operated in atmospheric air. Thus, it is possible to prevent the current injection region from becoming to have a high resistance resulting in an increase of voltage, which may occur when the hydrogen molecules pass through the current injection region or are diffused by the same. Accordingly, the nitride semiconductor light emitting device can work stably for a long period of time.

As to the method for manufacturing a nitride semiconductor light emitting device according to the third aspect described above, it is preferable that the method further include the steps of forming an electrode and/or an electrode pad above the current injection region, and forming the protection film above the electrode and/or the electrode pad. According to this structure, it is possible to prevent effectively hydrogen molecules contained in moisture in atmosphere from reaching the current injection region since the protection film is formed above the electrode and/or the electrode pad.

As to the method for manufacturing a nitride semiconductor light emitting device according to the third aspect described above, the method may further include the step of forming a ridge stripe structure in the nitride semiconductor layer so that the current injection region is the ridge stripe structure.

A method for manufacturing a nitride semiconductor light emitting device according to a fourth aspect of the present invention includes the steps of forming a nitride semiconductor layer having a p-type nitride semiconductor layer on a nitride semiconductor substrate, and forming a protection film made up of a silicon nitride film and/or a silicon nitride oxide film above the p-type nitride semiconductor layer.

According to the method for manufacturing a nitride semiconductor light emitting device of the fourth aspect described above, it is possible to prevent hydrogen molecules contained in moisture in atmosphere from reaching the p-type nitride semiconductor layer even if the obtained nitride semiconductor light emitting device is operated in atmospheric air, since the method includes the step of forming a protection film made up of a silicon nitride film and/or a silicon nitride oxide film above the p-type nitride semiconductor layer as described above. Thus, it is possible to prevent the p-type nitride semiconductor layer from becoming to have a high resistance resulting in an increase of voltage, which may occur when the hydrogen molecules pass through the p-type nitride semiconductor layer or are diffused by the same. Accordingly, the nitride semiconductor light emitting device can work stably for a long period of time.

As to the method for manufacturing a nitride semiconductor light emitting device according to the third or the fourth aspect, the method preferably includes the step of forming the silicon nitride film or the silicon nitride oxide film so that a thickness of the silicon nitride film or the silicon nitride oxide film becomes 6 nanometers or larger. According to this structure, it is possible to prevent easily the hydrogen molecules contained in moisture in atmosphere from reaching the nitride semiconductor layer.

As to the method for manufacturing a nitride semiconductor light emitting device according to the third or the fourth aspect described above, the method preferably includes the step of forming the silicon nitride oxide film so that the silicon nitride oxide film is expressed by a general formula $SiO_{1-x}N_x$, and that a composition ratio of nitrogen x in the silicon nitride oxide film is 0.1 or more. According to this structure, it is possible to prevent easily the hydrogen molecules contained in moisture in atmosphere from reaching the nitride semiconductor layer.

DETAILED DESCRIPTION OF THE PREFERRED EMBODIMENTS

Hereinafter, concrete embodiments of the present invention will be described in detail with reference to the attached drawings.

First Embodiment

Figure 1:
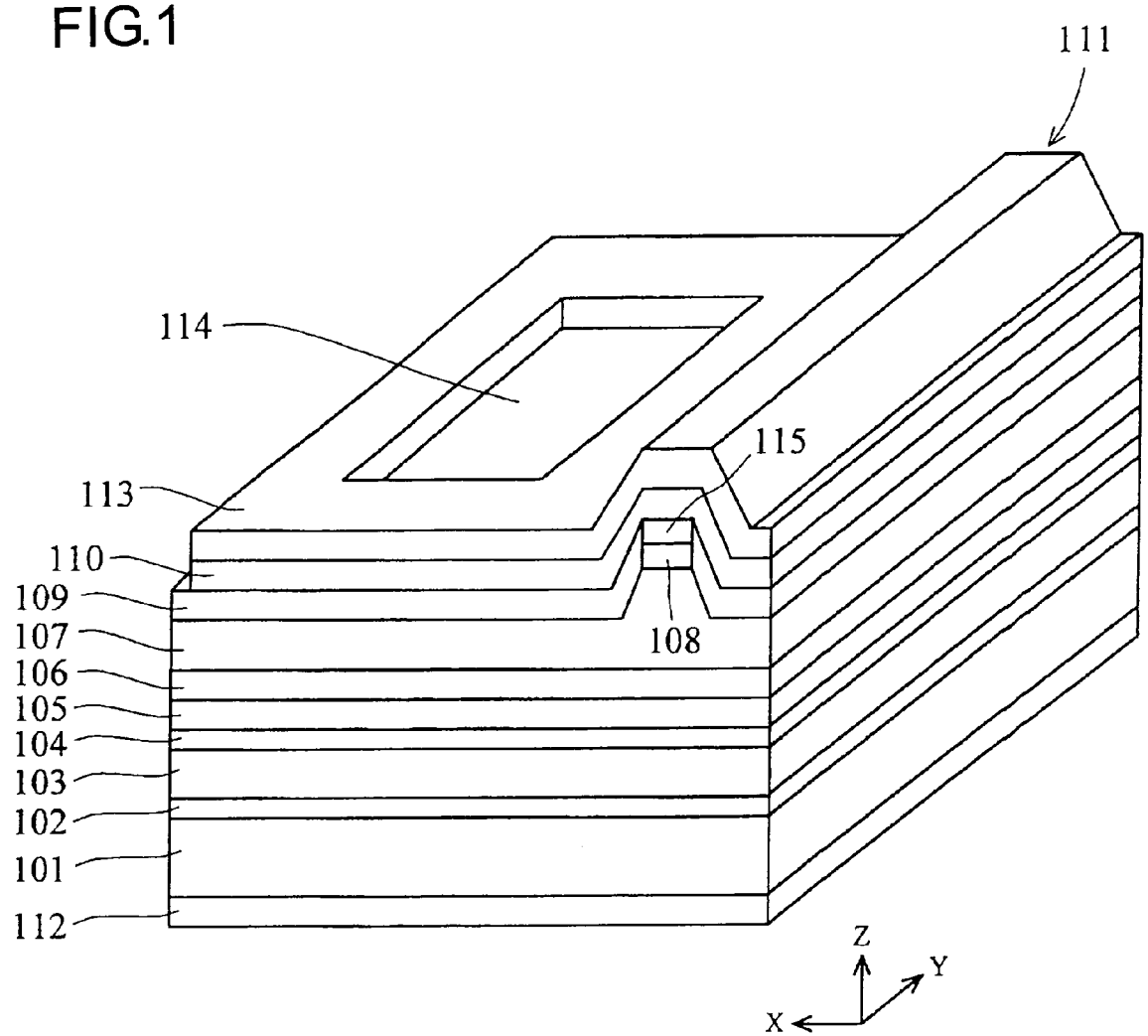
FIG. 1 is a perspective view of a nitride semiconductor laser chip according to a first embodiment of the present invention.
Figure 2:
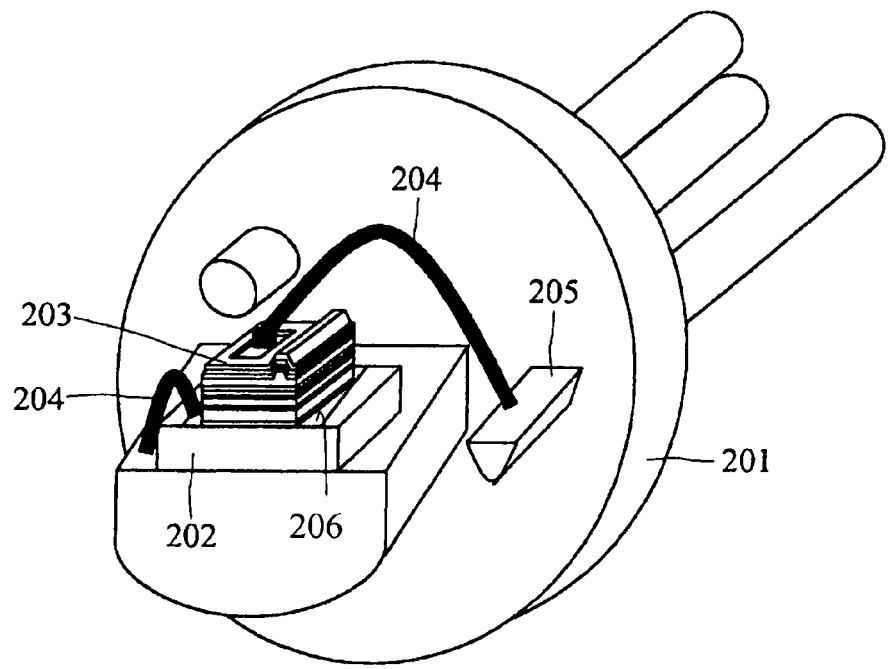
FIG. 2 is a schematic drawing of a nitride semiconductor laser device packed in a package using the nitride semiconductor laser chip shown in FIG. 1.

A first embodiment of the present invention will be described with reference to FIGS. 1 and 2. FIG. 1 is a perspective view of a nitride semiconductor laser chip according to the first embodiment of the present invention. FIG. 2 is a schematic diagram of a nitride semiconductor laser device packed in a package using the nitride semiconductor laser chip shown in FIG. 1.

The nitride semiconductor laser device according to the first embodiment has a p-type nitride semiconductor layer, and at least an active layer and a cladding layer are included in the p-type nitride semiconductor layer. The active layer and the cladding layer is made up of a material containing a principal component that is a compound of at least one type of group III(3) elements selected from a group consisting of aluminium (Al), indium (In) and gallium (Ga) and nitrogen that is a group V(5) element, and is expressed in the general formula (1) below. Further, the p-type nitride semiconductor layer according to the first embodiment is formed by doping magnesium (Mg), beryllium (Be) or the like in the material expressed by the general formula (1) below so as to have p-type conductivity.

$$Al_k In_l Ga_m N \qquad (1)$$

In this formula (1), k denotes a positive number satisfying $0 \leq k \leq 1$, l denotes a positive number satisfying $0 \leq l \leq 1$, and m denotes a positive number satisfying $0 \leq m \leq 1$, where k, l and m satisfies "k+l+m=1".

More specifically, the nitride semiconductor laser device according to the first embodiment has a structure shown in FIG. 1, which includes a n-type GaN substrate 101 on which are formed an n-type AlGaInN buffer layer 102 having a thickness of 0.2 microns, an n-type $Al_{0.05}Ga_{0.95}InN$ cladding layer 103 having a thickness of 2.2 microns, an n-type AlGaInN guiding layer 104 having a thickness of 20 nanometers, an AlGaInN multi quantum well active layer 105 having a thickness of 70 nanometers that is three laminated layers each of which includes a barrier layer made of InGaN having a thickness of 8 nanometers and a well layer made of InGaN having a thickness of 5 nanometers in such a manner that the final layer close to the p-type nitride semiconductor layer becomes a GaN layer, a p-type $Al_{0.3}Ga_{0.7}InN$ layer 106 having a thickness of 20 nanometers, a p-type $Al_{0.05}Ga_{0.95}InN$ cladding layer 107 having a thickness of 0.5 microns, and a p-type AlGaInN contact layer 108 having a thickness of 0.2 microns in this order. Note that the n-type GaN substrate is an example of the "nitride semiconductor substrate" of the present invention.

A wavelength of a laser beam emitted from the nitride semiconductor laser device of the present invention can be adjusted appropriately by a mixed crystal ratio of AlGaInN multiple quantum well active layer 105 within a range of 350 to 480 nanometers, for example. In the first embodiment, it was adjusted to emit a laser beam having a wavelength of 405 nanometers.

A part of each of the p-type AlGaInN cladding layer 107 and the p-type AlGaInN contact layer 108 is removed so that a ridge stripe part 111 is formed. More specifically, a part of the p-type AlGaInN cladding layer 107 is formed to be a protruding part like a stripe while other part of the same is removed. In addition, only a part of the p-type AlGaInN contact layer 108 formed on the upper surface of the protruding part of the p-type AlGaInN cladding layer 107 remains while other part of the same is removed. Described above, the ridge stripe part 111 having a stripe shape is formed so as to extend in a longitudinal direction of a resonator (in the Y direction). In the first embodiment, a stripe width of the ridge stripe part 111 (a width in the X direction) is 1.2 to 2.4 microns, and more preferably, approximately 1.5 microns.

In addition, a p-type electrode 115 is formed on the upper surface of the p-type AlGaInN contact layer 108. The p-type electrode 115 is made up of palladium (Pd) having a thickness of 50 nanometers that is formed so as to contact with the p-type contact layer 108. In addition, an insulating film 109 is formed on the upper surface of the p-type AlGaInN cladding layer 107 except for the part on which the ridge stripe part 111 is formed. The insulating film 109 is formed so as to contact with the p-type AlGaInN cladding layer 107 and is made up of two layers including a silicon oxide ($SiO_2$) layer having a thickness of 200 nanometers and a titanium oxide ($TiO_2$) layer having a thickness of 50 nanometers laminated in this order. Further, a p-type electrode pad 110 is formed on the upper surface of the p-type AlGaInN cladding layer 107 and the upper surface of the p-type electrode 115. The p-type electrode pad 110 is made up of two layers including a molybdenum (Mo) layer having a thickness of 20 nanometers and a gold (Au) layer having a thickness of 200 nanometers laminated in this order from the insulating film 109.

The nitride semiconductor laser device according to the first embodiment has a current injection region in the nitride semiconductor layer, to which current is injected. In general, current is injected into an active layer region of the nitride semiconductor layer. Therefore, the current injection region means the active layer region to which current is injected. For example, in the ridge stripe type nitride semiconductor laser device of the first embodiment, the p-type nitride semiconductor layer region directly below the ridge stripe part becomes the current injection region. More specifically, in the first embodiment, the active layer region to be the current injection region is made up of the p-type AlGaInN contact layer 108 and parts of the p-type AlGaInN cladding layer 107 and the p-type AlGaInN layer 106 below the p-type AlGaInN contact layer 108. Furthermore, when current is injected into the current injection region, light is emitted from it. In other words, the current injection region is also a light emitting region. In the first embodiment, the active layer region directly below the ridge stripe part becomes the light emitting region.

As to the nitride semiconductor light emitting device of the present invention, a protection film made up of a silicon nitride film or a silicon nitride oxide film or a silicon nitride film and a silicon nitride oxide film is formed above the current injection region or the electrode or the electrode pad or the electrode and the electrode pad. In the first embodiment, a protection film 113 is formed on the upper surface of the p-type electrode pad 110 as shown in FIG. 1. Since the protection film 113 is formed in this way, it is possible to prevent hydrogen molecules contained in moisture in atmosphere from reaching the p-type nitride semiconductor layer when the nitride semiconductor laser device including the p-type nitride semiconductor layer is operated in atmospheric air. Thus, it is possible to prevent the p-type nitride semiconductor layer from becoming to have a high resistance resulting in an increase of voltage, which may occur when the hydrogen molecules pass through the p-type nitride semiconductor layer or are diffused by the same.

In addition, a wire bonding window 114 is formed in the protection film 113. The wire bonding window 114 is a window for bonding wires that will be described later to the p-type electrode pad 110 under the protection film 113. Since the protection film 113 is an insulating film, current cannot be injected via the wires if the entire surface of the p-type electrode pad 110 is covered with the protection film 113. Therefore the wire bonding window 114 is formed.

Furthermore, an n-type electrode 112 is formed on the surface of n-type GaN substrate 101 opposite to the upper surface on which the individual layers are formed. The n-type electrode 112 is formed so as to contact with the n-type GaN substrate 101 and is made up of five layers including a hafnium (Hf) layer having a thickness of 30 nanometers, an aluminium (Al) layer having a thickness of 200 nanometers, a molybdenum (Mo) layer having a thickness of 30 nanometers, a platinum (Pt) layer having a thickness of 50 nanometers, and a gold (Au) layer having a thickness of 200 nanometers.

Next, a method for manufacturing the nitride semiconductor laser device according to the first embodiment will be described.

First, the n-type AlGaInN buffer layer 102 having a thickness of 0.2 microns, the n-type $Al_{0.05}Ga_{0.95}InN$ cladding layer 103 having a thickness of 2.2 microns, and the n-type AlGaInN guiding layer 104 having a thickness of 20 nanometers are laminated and formed in this order on the n-type GaN substrate 101 having a thickness of 450 microns (2 inch wafer) by using an MOCVD (Metal Organic Chemical Vapor Deposition) film forming apparatus, for example.

Next, layers including a barrier layer made of InGaN having a thickness of 8 nanometers and a well layer made of InGaN having a thickness of 5 nanometers are laminated in three layers in such a manner that the final layer close to the p-type nitride semiconductor layer becomes a GaN layer, so as to form the AlGaInN multiple quantum well active layer 105 having a thickness of 70 nanometers. Next, the p-type $Al_{0.3}Ga_{0.7}InN$ layer 106 having a thickness of 20 nanometers, the p-type $Al_{0.05}Ga_{0.95}InN$ cladding layer 107 having a thickness of 0.5 microns and the p-type AlGaInN contact layer 108 having a thickness of 0.2 microns are laminated and formed in this order. After that, a palladium (Pd) layer having a thickness of 50 nanometers is formed on the p-type AlGaInN contact layer 108 by an electron beam (EB) vapor deposition method, so that the p-type electrode 115 is formed.

Next, a mask like a stripe is formed on the p-type electrode 115 for forming the ridge stripe part 111 by a photo lithography process. Then, the p-type electrode 115, the p-type AlGaInN contact layer 108 and the p-type AlGaInN cladding layer 107 are etched to a depth of a middle of the p-type AlGaInN cladding layer 107 by using an ICP (Inductively Coupled Plasma) etching method, for example. Although the depth of etching is determined based on a specification required to the device, the etching was performed to the vicinity of the bottom of the p-type AlGaInN cladding layer 107 in the first embodiment. In this way, the ridge stripe part 111 is formed.

Next, the insulating film 109 including a silicon oxide ($SiO_2$) layer having a thickness of 200 nanometers and a titanium oxide ($TiO_2$) layer having a thickness of 50 nanometers is formed on the upper surface of the ridge stripe part 111 and the p-type AlGaInN cladding layer 107 by using the EB vapor deposition method, the sputtering method or the like.

Then, the ridge stripe mask and the insulating film 109 formed on the p-type electrode 115 are removed by a lift off method. After that, a molybdenum (Mo) layer having a thickness of 20 nanometers and a gold (Au) layer having a thickness of 200 nanometers are formed above the insulating film 109 and the p-type electrode 115 in this order from the insulating film 109 by using the EB vapor deposition method or the like, so that the p-type electrode pad 110 is formed.

Next, a mask using a resist is formed by using the photo lithography process on the upper surface of the p-type electrode pad 110 at the part where the wire bonding window 114 is formed. Next, the protection film 113 is formed on the p-type electrode pad 110 by using the ECR (Electron Cyclotron Resonance) sputtering method. In the first embodiment, the protection film 113 has a two layer structure including a silicon nitride film and a silicon oxide film, the silicon nitride film is formed so as to contact with the p-type electrode pad, and the silicon oxide film is formed on the silicon nitride film.

Figure 9:
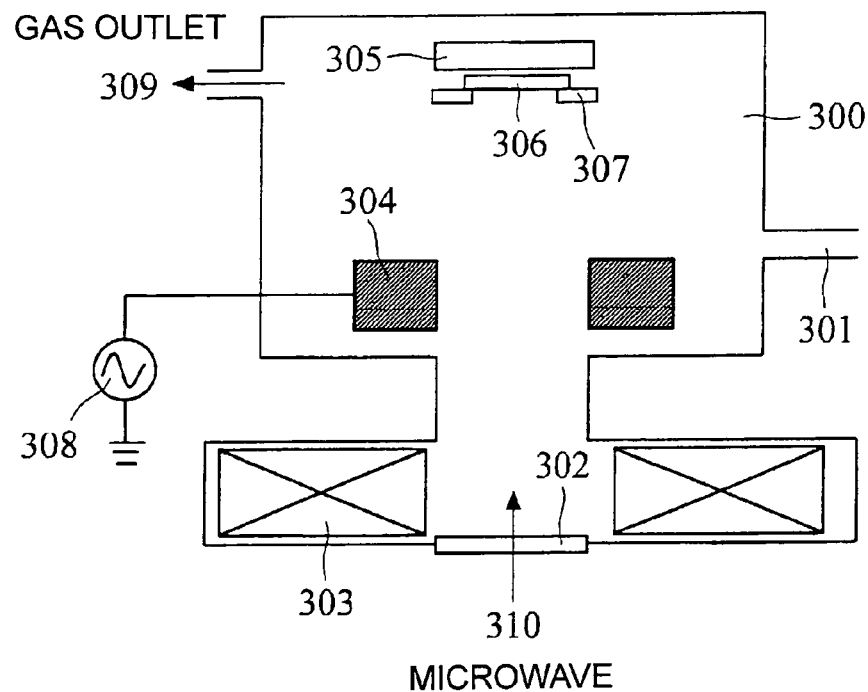
FIG. 9 is a schematic structural drawing of an ECR sputtering film forming apparatus.
Figure 10:
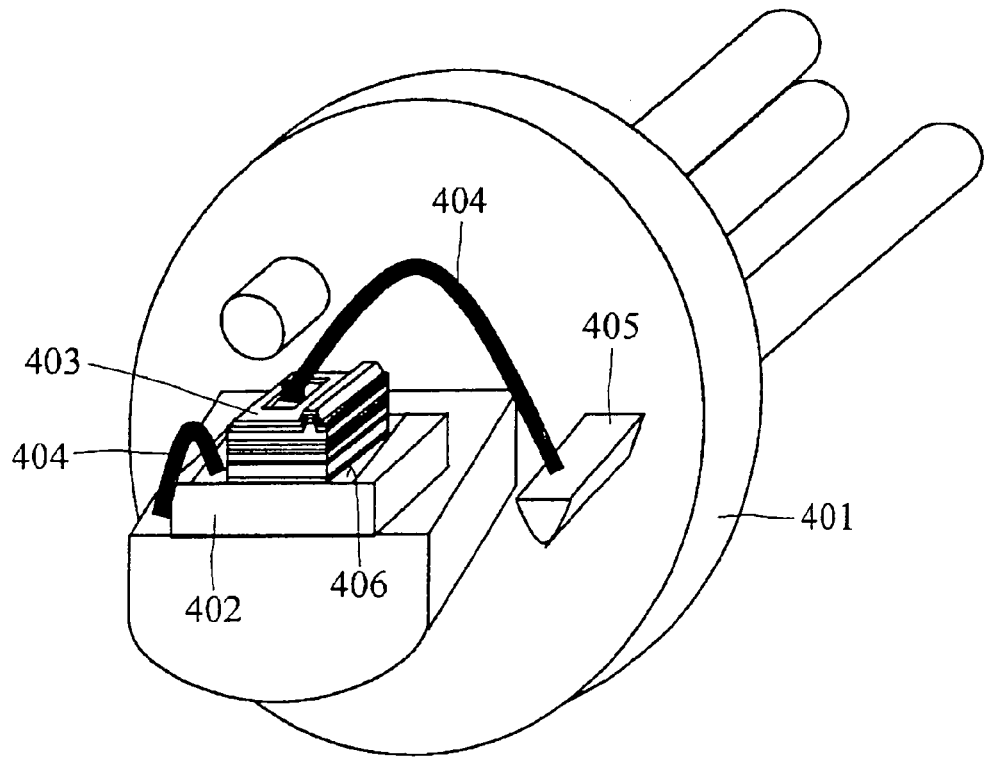
FIG. 10 is a schematic drawing showing the inside of a conventional nitride semiconductor laser device.
Figure 11:
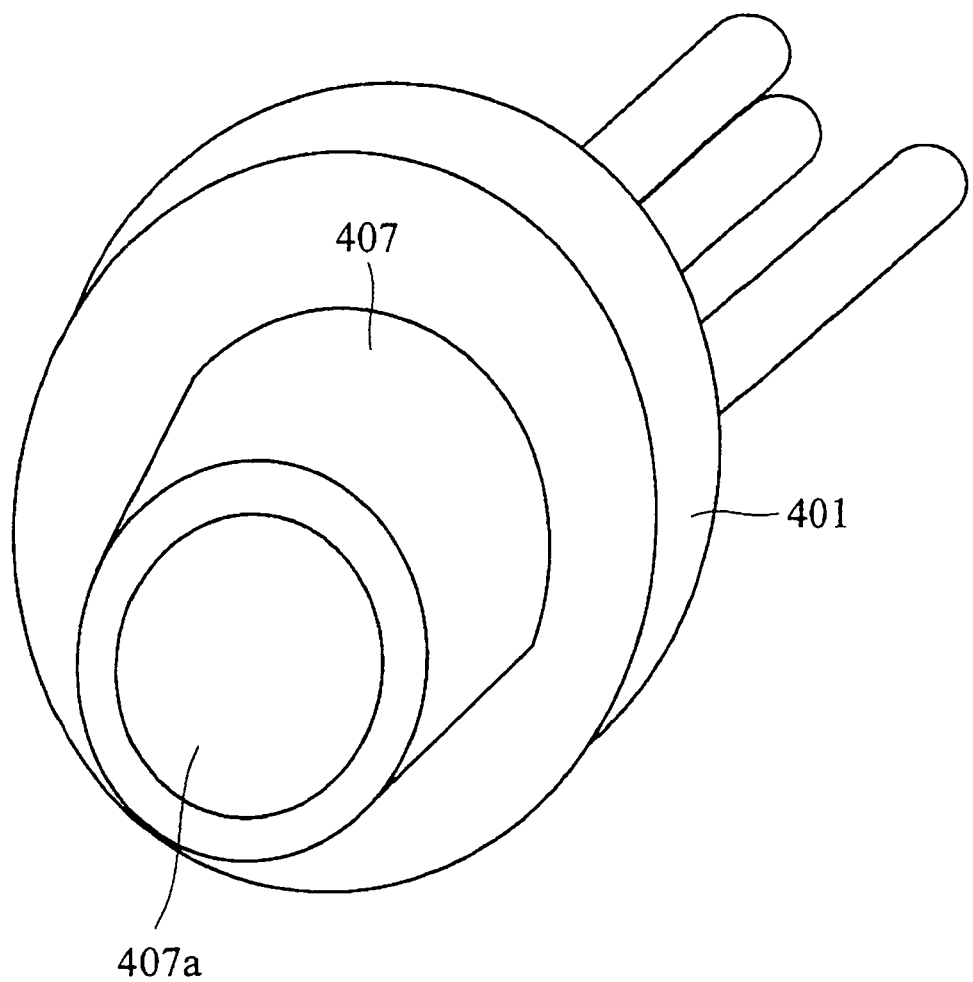
FIG. 11 is a drawing showing an external view of the conventional nitride semiconductor laser device.

Here, a method for manufacturing the protection film will be described. The protection film can be formed by a reactive sputtering method such as the ECR sputtering method, a CVD (Chemical Vapor Deposition) method, the EB vapor deposition method or the like, for example. In the first embodiment, the ECR sputtering method is used for manufacturing the protection film. The method for manufacturing the protection film using the ECR sputtering method will be described with reference to FIG. 9. FIG. 9 is a schematic structural drawing of the ECR sputtering film forming apparatus.

The ECR sputtering method is a method for forming a thin film in which plasma generated by the ECR is utilized for generating a sputtering phenomenon when a voltage is applied to a target placed at a periphery of the plasma and ions in the plasma are accelerated to enter the target so that emitted particles of the target are adhered to a surface of a sample placed nearby. Furthermore, in the present invention, the thin film formed on the surface of the sample corresponds to the protection film.

The ECR sputtering film forming apparatus is equipped with a film forming chamber 300, a magnetic coil 303 and a microwave lead-in window 302 as shown in FIG. 9. The film forming chamber 300 is equipped with a gas inlet 301 and a gas outlet 309. A target 304 connected to an RF power supply 308 and a heater 305 are placed in the film forming chamber 300. In addition, a sample table 307 is disposed in the film forming chamber 300, and a sample 306 on which a thin film (the protection film) should be formed is placed on the sample table 307. Note that the magnetic coil 303 is used for generating a magnetic field necessary for generating plasma, and the RF power supply 308 is used for sputtering the target 304. In addition, a microwave 310 is led into the film forming chamber 300 through the microwave lead-in window 302.

As the target 304 for forming the protection film according to the present invention, a silicon target or a silicon oxide target is used. For example, if a silicon nitride film is to be formed, a silicon target is placed as the target 304, and nitrogen gas is led into the film forming chamber 300 through the gas inlet 301 at a flow rate of 5.5 sccm. In addition, argon gas is led into at a flow rate of 40.0 sccm, so that plasma can be generated efficiently for increasing the deposition rate. Then, a microwave necessary for generating plasma is applied, and a predetermined voltage is applied to the silicon target. Thus, a silicon nitride film can be formed on the surface of the sample 306 placed on the sample table 307. Furthermore, if oxygen gas is led into the film forming chamber 300 instead of the nitrogen gas, a silicon oxide film can be formed.

If a silicon nitride oxide film is to be formed, oxygen plasma is generated by applying a microwave while oxygen gas is led into the film forming chamber 300 in which a silicon target is placed. Then, the silicon target is exposed to the oxygen plasma so that the silicon target is oxidized to a depth of a few nanometers or so from the surface of the silicon target (Step 1). Thus, a target made of silicon oxide is formed temporarily. Next, nitrogen gas and argon gas are led into the film forming chamber 300 while a microwave is applied for producing a plasma state. Then, the target made of silicon oxide is sputtered, so that a silicon nitride oxide film is formed on the sample placed on the sample table 307 (Step 2). On this occasion, an oxygen content in the silicon nitride oxide film can be changed by changing a gas ratio between the nitrogen gas and the oxygen gas.

However, in case of forming the silicon nitride oxide film by using the silicon target as described above, if the oxygen gas is led into the film forming chamber 300, it is difficult to control the composition of oxygen and nitrogen resulting in a low reproducibility if a silicon nitride oxide film having a low oxygen content is formed, because of a high oxidizing property of silicon. In this case, a silicon oxide having a low oxidization state expressed by a composition formula $Si_pO_q$ (here, $0<p<1$, $0<q<0.67$, and $p+q=1$) may be used as the target 304 while only the nitrogen gas may be led into the film forming chamber 300 without the oxygen gas. Then, a microwave necessary for generating plasma may be applied while a predetermined voltage may be applied to the silicon oxide target. Then, a silicon nitride oxide film having a low oxygen content can be formed relatively easily. In addition, if a target made of silicon nitride oxide having a low oxygen content is used instead of the target made of the silicon oxide having a low oxidization state expressed by a composition formula $Si_pO_q$ (here, $0<p<1$, $0<q<0.67$, and $p+q=1$) described above, a similar effect can be obtained.

In addition, instead of adjusting the oxygen and nitrogen contents in the silicon nitride oxide film, i.e., the composition ratio, it is possible to change a film forming condition such as a degree of vacuum in the film forming chamber, a film forming temperature, or both the degree of vacuum and the film forming temperature, so that the oxygen content in the silicon nitride oxide film can be changed and the composition of the silicon nitride oxide film can be changed easily. Furthermore, the lower the degree of vacuum in the film forming chamber is, the easier the oxygen can be lead into the silicon nitride oxide film. The higher the film forming temperature, the more difficult it is to lead oxygen to the silicon nitride oxide film.

In addition, the inside wall of the film forming chamber may be oxidized or a silicon oxide is formed on the inside wall of the film forming chamber. Then, argon gas and nitrogen gas may be led into the film forming chamber while a silicon target may be used for forming a film by the sputtering method. Then, oxygen of the inside wall of the film forming chamber is removed by plasma so that a protection film made of a silicon nitride oxide film can be formed. If the reactive sputtering method described above is used for sputtering the target by using argon gas, argon can be contained in the formed protection film at a very small quantity (approximately 0 to 10%). In the present invention, the formed protection film can be used for the nitride semiconductor light emitting device according to the present invention in either case where it contains argon or not.

In addition, before forming the protection film, cleaning of the surface of the nitride semiconductor layer, the electrode or the electrode pad may be performed between the step 1 and the step 2 described above, in order to improve adhesive properties between the protection film and the nitride semiconductor layer, the electrode or the electrode pad. The cleaning may be performed by heating, or by applying argon plasma, nitrogen plasma or argon and nitrogen mixed gas plasma. Furthermore, it is possible to combine the cleaning by heating and the cleaning by applying plasma. In case of the cleaning by applying plasma, it is possible to adopt a two-stage cleaning in which nitrogen plasma is applied after argon plasma is applied or in the opposite order. In addition, it is possible to use an inert gas such as helium (He), neon (Ne), xenon (Xe) or krypton (Kr) other than the argon and the nitrogen.

In the method of cleaning by heating, for example, the nitride semiconductor light emitting device just before forming the protection film is placed in the film forming chamber and is heated at a temperature of 100 to 500 degrees centigrade, so that an oxide film or impurities adhered to the surface of the nitride semiconductor layer, the electrode or the electrode pad is removed. In the method of cleaning by applying plasma, argon plasma, nitrogen plasma or the like is applied to the surface of the nitride semiconductor layer, the electrode, the electrode pad or the like for cleaning. It is possible to apply the plasma while heating. The step of forming the protection film after the cleaning step is preferably performed in a state heated at a temperature of 100 to 500 degrees centigrade. However, it is also possible to form the protection film without heating.

As to a concrete method of manufacturing the protection film according to the first embodiment, a silicon target is used as the target 304 shown in FIG. 9, and nitrogen gas is led into the film forming chamber 300 through the gas inlet 301 at a flow rate of 5.5 sccm. In addition, argon gas is led into the chamber at a flow rate of 40.0 sccm so that plasma can be generated efficiently for increasing the deposition rate. Then, an RF power of 500 W from the RF Power supply 308 is applied to the silicon target for sputtering the silicon target, and a microwave power of 500 W necessary for generating plasma is applied so as to form the protection film 113 at a deposition rate of 0.17 nanometers per second, which includes a silicon nitride film having a thickness of 500 nanometers with a refractive index of 2.0 for light of a wavelength of 633 nanometers and a silicon oxide film having a thickness of 200 nanometers with a refractive index of 1.4 for the light.

Then, after forming the protection film 113, the mask at the part of the wire bonding window 114 and the protection film 113 are removed by the lift off method, so that the wire bonding window 114 is formed.

Next, the n-type GaN substrate 101 having a thickness of 450 microns is ground and polished to be an n-type GaN substrate having a thickness of 130 microns. Next, using the EB vapor deposition method, a hafnium (Hf) layer having a thickness of 30 nanometers, an aluminium (Al) layer having a thickness of 200 nanometers, a molybdenum (Mo) layer having a thickness of 30 nanometers, a platinum (Pt) layer having a thickness of 50 nanometers and a gold (Au) layer having a thickness of 200 nanometers are laminated in this order to form the n-type electrode 112 on the surface of the n-type GaN substrate 101 opposite to the upper surface on which laminated layers are formed.

Next, the disc-like wafer manufactured as described above is cleaved to make a bar-like shape. In the first embodiment, the {1-100} surface is selected as the cleavage surface. Next, a coating film is formed on the cleavage surface. More specifically, using the ECR sputtering method, a lamination structure is formed so as to contact with the cleavage surface on the light emitting end, in which the lamination structure includes an aluminium nitride oxide layer (AlON) having a thickness of 20 nanometers, a silicon nitride film (SiN) having a thickness of 150 nanometers and an aluminium oxide layer ($Al_2O_3$) having a thickness of 140 nanometers. On the other hand, after forming the lamination structure including an aluminium nitride oxide layer (AlON) having a thickness of 20 nanometers, a silicon nitride film (SiN) having a thickness of 150 nanometers and an aluminium oxide layer ($Al_2O_3$) having a thickness of 140 nanometers so as to contact with the cleavage surface on the light emitting end, four pairs of a silicon oxide film having a thickness of 71 nanometers and a titanium oxide film having a thickness of 46 nanometers are laminated so that the top surface becomes the silicon oxide film. Then, a silicon oxide film having a thickness of 142 nanometers is formed on the top surface so that a high reflection film is formed. After that, the bar-like device is divided into the nitride semiconductor laser chips. Note that a specular surface formed by the cleavage (a cleavage end face) is used as a resonator end face in the present invention.

The nitride semiconductor laser chip manufactured into a chip as described above is used for a nitride semiconductor laser chip 203 shown in FIG. 2 so that the nitride semiconductor laser device is manufactured. More specifically, the nitride semiconductor laser chip 203 is soldered to a sub mount (SiC) 202 as a heat sink by using solder (gold tin) 206, and then the sub mount 202 with the nitride semiconductor laser chip 203 is soldered onto a holding substrate (stem) 201 with the solder (gold tin) (not shown). After that, a pin 205 provided to the holding substrate (stem) 201 is connected electrically to the nitride semiconductor laser chip 203 with a wire 204. The wire 204 is connected to the wire bonding window 114 shown in FIG. 1 on the side of the nitride semiconductor laser chip 203. In other words, the p-type electrode pad 110 of the nitride semiconductor laser chip 203 is connected to the pin 205 of the holding substrate (stem) 201 via the wire 204.

Figure 3:
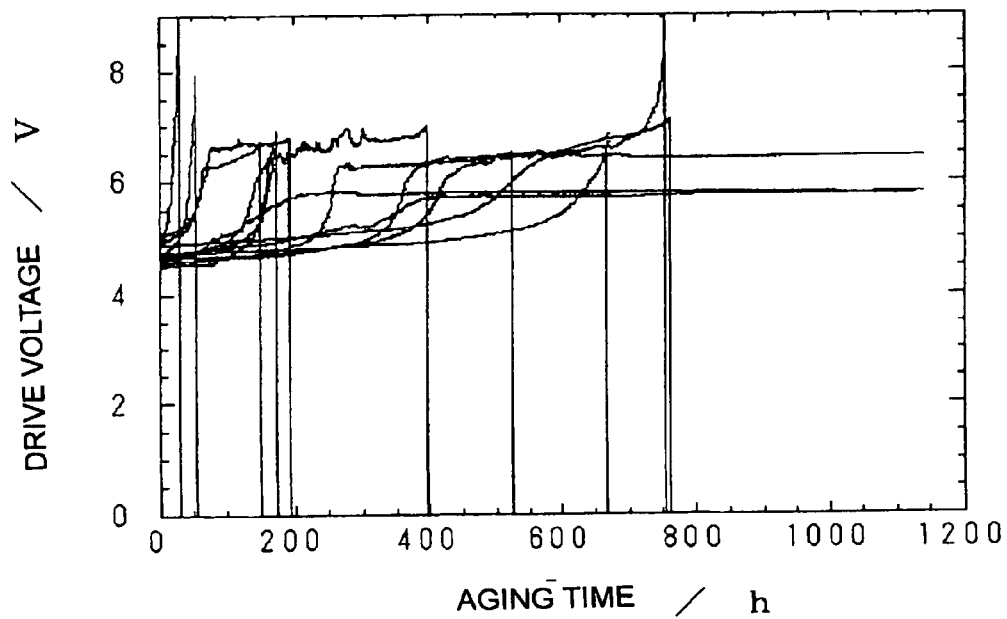
FIG. 3 is a diagram showing a result of an aging test of a nitride semiconductor laser device according to a comparison example 1.
Figure 4:
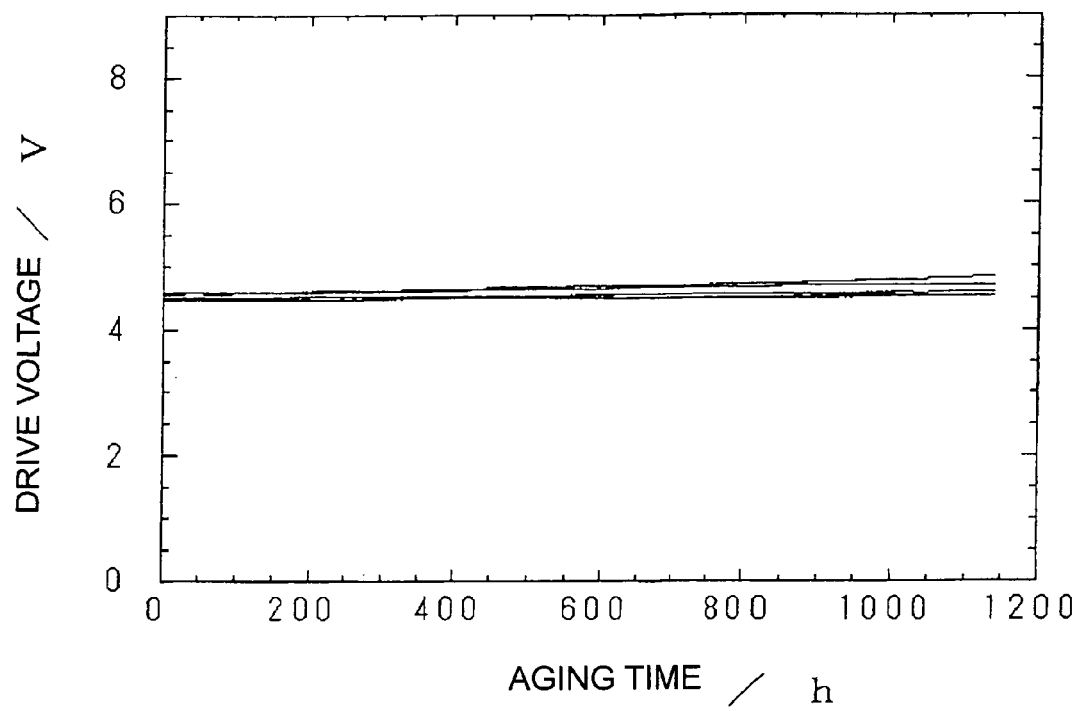
FIG. 4 is a diagram showing a result of an aging test of a nitride semiconductor laser device according to the first embodiment.

Next, an aging test of the nitride semiconductor laser device according to the first embodiment will be described with reference to FIGS. 3 and 4. The nitride semiconductor laser device according to the first embodiment manufactured as described above was used for performing the aging test. The nitride semiconductor laser chip 203 was operated in the open air package while a variation of the drive voltage was tested. A result of the test is shown in FIGS. 3 and 4. FIG. 3 shows a result of the aging test of the nitride semiconductor laser device according to the comparison example 1 that will be described later. FIG. 4 shows a result of the aging test of the nitride semiconductor laser device according to the first embodiment.

Comparative Example 1

For a comparison with the nitride semiconductor laser device according to the first embodiment, a nitride semiconductor laser device without the protection film 113 is manufactured into a chip similarly to the first embodiment so that the nitride semiconductor laser chip of the comparison example 1 was formed. Then, similarly to the method described above, the nitride semiconductor laser device of the comparison example 1 was formed by mounting it on the holding substrate (stem).

(Aging Test)

The nitride semiconductor laser device according to the first embodiment and the nitride semiconductor laser device according to the comparison example 1 were used for performing the aging test. The aging test was performed in atmospheric air at a temperature of 70 degrees centigrade and a humidity of 20 to 40% under the condition of output power corresponding to 10 mW continuously (CW). In the first embodiment, the nitride semiconductor laser device in the state without a cap as shown in FIG. 2 is used for performing the aging test.

As shown in FIG. 3, some of the nitride semiconductor laser devices of the comparison example 1 have a voltage rise in the Vop (operating voltage) by approximately 1 V after approximately 100 hours. On the other hand, none of the nitride semiconductor laser devices of the first embodiment has a voltage rise in the Vop (operating voltage) as shown in FIG. 4, and each of them was operating stably after 1,000 hours or more. From this result, it is understood that the formed protection film 113 can suppress a voltage rise of the Vop (operating voltage) so that the device can operate stably even if the nitride semiconductor laser device is operated in the atmospheric air.

A mechanism that the formed protection film 113 can suppress a voltage rise of the Vop (operating voltage) so that the device can operate stably even if the nitride semiconductor laser device is operated in the atmospheric air can be considered as follows.

In contrast with the dry air, the atmospheric air contains a lot of moisture ($H_2O$, —H group and —OH group). Since the protection film is not formed in the nitride semiconductor laser device of the comparison example 1, hydrogen molecules contained in the moisture in atmosphere pass through the p-type electrode pad 110 and the p-type electrode 115 on the top surface of the nitride semiconductor laser device of the comparison example 1 and are diffused by the same. The diffused hydrogen molecules reach the insulating film 109 formed on the undersurface of the p-type electrode pad 110, so as to pass through the insulating film 109 and be diffused by the same. Further, the hydrogen molecules pass through the p-type AlGaInN cladding layer 107 and the p-type AlGaInN contact layer 108 and are diffused by the same, and further pass through the p-type AlGaInN layer 106 and are diffused by the same. It is considered that when the hydrogen molecules are diffused by the p-type AlGaInN layer 106, the p-type AlGaInN cladding layer 107, and the p-type AlGaInN contact layer 108, the hydrogen molecules diffused by at least one layer compensate for Mg dopant contained in the layer so as to become to have a high resistance.

On the other hand, since the protection film 113 is formed in the nitride semiconductor laser device of the first embodiment, it is considered that the hydrogen molecules contained in the moisture in atmosphere are bonded with the Si group of the silicon nitride film included in the protection film and are accumulated in the protection film so that the diffusion is suppressed. Therefore, it is considered that the hydrogen molecules do not reach any of the p-type AlGaInN layer 106, the p-type AlGaInN cladding layer 107 and the p-type AlGaInN contact layer 108, so that the high resistance phenomenon due to the compensation by the hydrogen molecules for Mg dopant can be suppressed. Described above, an increase of the Vop (operating voltage) due to the high resistance of the p-type nitride semiconductor layer can be suppressed by forming the protection film 113 on the p-type nitride semiconductor layer into which current is injected, so that the nitride semiconductor laser chip can be operated stably. Furthermore, there is a tendency that the voltage rise is caused more often if the p-type nitride semiconductor layer includes aluminium and if content aluminium is higher.

Figure 5:
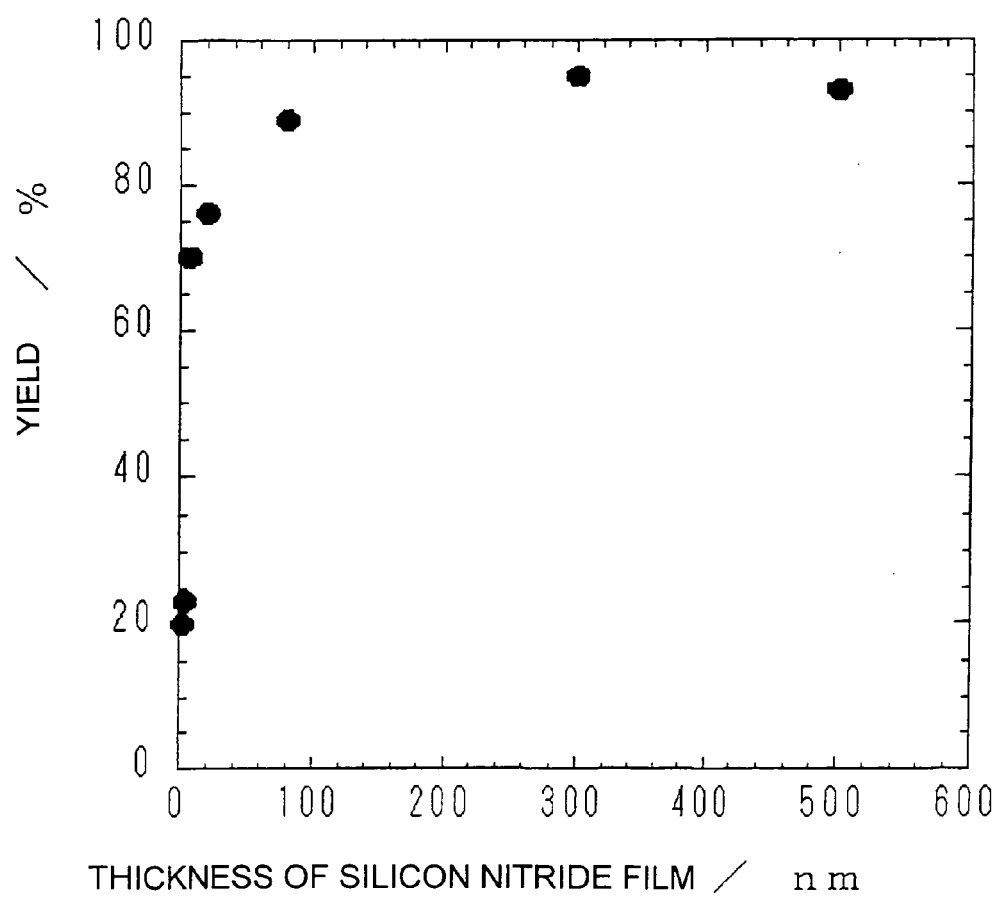
FIG. 5 is a diagram showing a relationship between a thickness of a silicon nitride film constituting a protection film of the nitride semiconductor laser device and yields according to the first embodiment.
Figure 6:
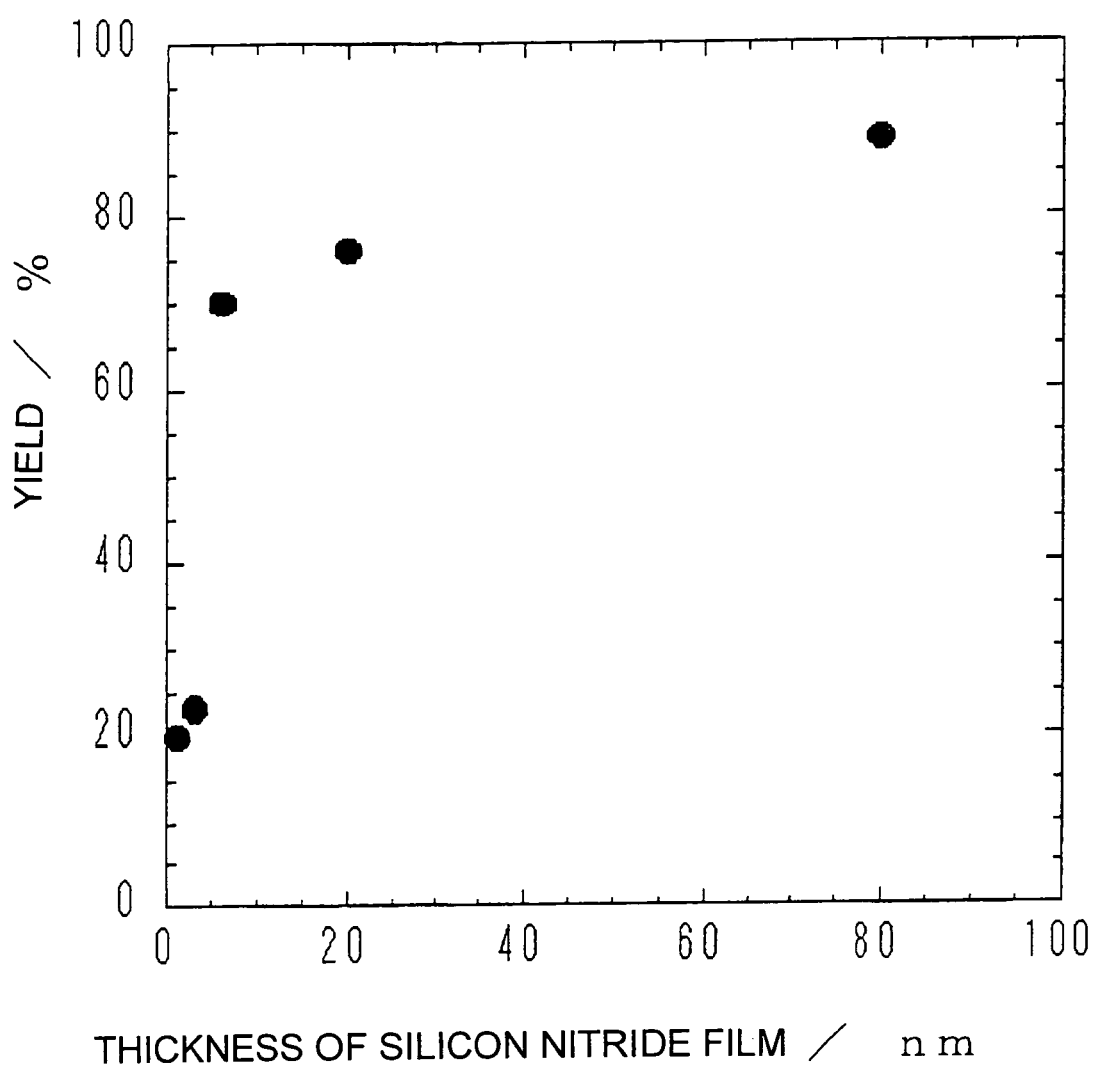
FIG. 6 is an enlarged view of a part of the diagram showing a relationship between a thickness of a silicon nitride film and yields shown in FIG. 5.

Next, a relationship between a thickness of the silicon nitride film constituting the protection film 113 of the first embodiment and yields will be described with reference to FIGS. 5 and 6. FIG. 5 is a diagram showing a relationship between a thickness of a silicon nitride film constituting a protection film of the nitride semiconductor laser device of the first embodiment and yields. FIG. 6 is an enlarged view of a part of the diagram showing a relationship between a thickness of a silicon nitride film and yields shown in FIG. 5.

(Manufacturing of Samples)

The nitride semiconductor laser chip was manufactured so that a thickness of the silicon nitride film in the protection film 113 became 1 to 500 microns, and the obtained nitride semiconductor laser chip was used for manufacturing the nitride semiconductor laser device.

(Aging Test)

The nitride semiconductor laser device described above was used for performing the aging test in the atmospheric air at a temperature of 70 degrees centigrade and a humidity of 20 to 40% and under the condition of output power corresponding to 10 mW continuously (CW). Note that the aging test was performed in the state without the cap as shown in FIG. 2 similarly to the case described above.

(Evaluation of Yields)

After 1,000 hours or longer of the aging test performed as described above, yields of nitride semiconductor laser devices that did not cause the voltage rise were evaluated.

As shown in FIG. 5, there is a tendency that higher yields are obtained as a thickness of the silicon nitride film is larger. In addition, as shown in FIG. 6, when the thickness of the silicon nitride film is 6 nanometers, yields increases largely up to approximately 70%. From this result, the thickness of the silicon nitride film should preferably be 6 nanometers or larger in order to operate the nitride semiconductor laser device stably for a long period of time. If the thickness of the silicon nitride film is smaller than 6 nanometers, control of the thickness becomes difficult because of the thin silicon nitride film. In this case, there may be a part where the silicon nitride film is not formed. As a result, hydrogen molecules contained in the moisture in atmosphere can reach the p-type nitride semiconductor layer easily through the part where the silicon nitride film is formed insufficiently. Thus, it is considered that when the hydrogen molecules pass through the p-type nitride semiconductor layer and are diffused by the same, the p-type nitride semiconductor layer will become to have a high resistance so that the voltage rise occurs resulting in a decrease of yields. In addition, as shown in FIG. 5, in order to suppress a rise of the Vop (operating voltage) of the nitride semiconductor laser device for 1,000 hours or longer so that the device can operate stably for a long period of time, the thickness of the silicon nitride film should preferably be 80 nanometers or larger, and more preferably, 300 nanometers or larger. Although the thickness of the silicon nitride layer in the protection film 113 is described here, a thickness of the silicon nitride oxide film should also preferably be 6 nanometers or larger so that the same effect can be obtained.

Second Embodiment

Next, a second embodiment of the present invention will be described. In the second embodiment of the present invention, the protection film 113 was formed as a protection film 113b of a single layer of a silicon nitride oxide film ($SiO_{1-x}N_x$) having a thickness of 500 nanometers, so that the nitride semiconductor laser device of the second embodiment was manufactured. As a result of Auger analysis of this protection film 113b, a composition ratio of nitrogen x in the protection film 113b (silicon nitride oxide film ($SiO_{1-x}N_x$)) was 0.6. The aging test of the nitride semiconductor laser device having this protection film 113b according to the second embodiment was performed similarly to the first embodiment described above. As a result, the voltage rise due to the aging was not found also in the nitride semiconductor laser device of the second embodiment similarly to the first embodiment, and it was confirmed that the nitride semiconductor laser device can work stably for a long period of time. Note that the structure of the second embodiment is the same as the first embodiment except for the protection film 113b instead of the protection film 113.

Third Embodiment

Next, a third embodiment of the present invention will be described. In the third embodiment of the present invention, the protection film 113 was formed as a protection film 113c of two layers including a silicon nitride oxide film having a thickness of 300 nanometers formed on the upper surface of the p-type electrode pad 110 and a silicon oxide film having a thickness of 120 nanometers formed on the upper surface of the silicon nitride oxide film, so that the nitride semiconductor laser device of the third embodiment was manufactured. As a result of Auger analysis of this protection film 113c, a composition ratio of nitrogen x in the silicon nitride oxide film ($SiO_{1-x}N_x$) included in the protection film 113c was 0.8. The aging test of the nitride semiconductor laser device having this protection film 113c according to the third embodiment was performed similarly to the first embodiment. As a result, the voltage rise due to the aging was not found also in the nitride semiconductor laser device of the third embodiment, and it was confirmed that the nitride semiconductor laser device can work stably for a long period of time. Note that the structure of the third embodiment is the same as the first embodiment except for the protection film 113c instead of the protection film 113.

Fourth Embodiment

Next, a fourth embodiment of the present invention will be described. In the fourth embodiment of the present invention, the protection film 113 was formed as a protection film 113d of two layers including a silicon oxide film having a thickness of 50 nanometers formed on the upper surface of the p-type electrode pad 110 and a silicon nitride film having a thickness of 300 nanometers formed on the upper surface of the silicon oxide film, so that the nitride semiconductor laser device of the fourth embodiment was manufactured. The aging test of the nitride semiconductor laser device having this protection film 113d according to the fourth embodiment was performed similarly to the first embodiment. As a result, the voltage rise due to the aging was not found also in the nitride semiconductor laser device of the fourth embodiment, and it was confirmed that the nitride semiconductor laser device can work stably for a long period of time. Note that the structure of the third embodiment is the same as the first embodiment except for the protection film 113d instead of the protection film 113.

Fifth Embodiment

Next, a fifth embodiment of the present invention will be described. In the fifth embodiment of the present invention, the protection film 113 was formed as a protection film 113e of three layers including a silicon oxide film having a thickness of 50 nanometers formed on the upper surface of the p-type electrode pad 110, a silicon nitride film having a thickness of 300 nanometers formed on the upper surface of the silicon oxide film and a silicon oxide film having a thickness of 120 nanometers formed on the upper surface of the silicon nitride film, so that the nitride semiconductor laser device of the fifth embodiment was manufactured. The aging test of the nitride semiconductor laser device having this protection film 113e according to the fifth embodiment was performed similarly to the first embodiment. As a result, the voltage rise due to the aging was not found also in the nitride semiconductor laser device of the fifth embodiment, and it was confirmed that the nitride semiconductor laser device can work stably for a long period of time. Note that the structure of the fifth embodiment is the same as the first embodiment except for the protection film 113e instead of the protection film 113.

Sixth Embodiment

Next, a sixth embodiment of the present invention will be described. In the sixth embodiment of the present invention, the protection film 113 was formed as a protection film 113f of a single layer of a silicon nitride film having a thickness of 150 nanometers, so that the nitride semiconductor laser device of the sixth embodiment was manufactured. The aging test of the nitride semiconductor laser device having this protection film 113f according to the sixth embodiment was performed similarly to the first embodiment. As a result, the voltage rise due to the aging was not found also in the nitride semiconductor laser device of the sixth embodiment, and it was confirmed that the nitride semiconductor laser device can work stably for a long period of time. Note that the structure of the sixth embodiment is the same as the first embodiment except for the protection film 113f instead of the protection film 113.

Seventh Embodiment

Figure 7:
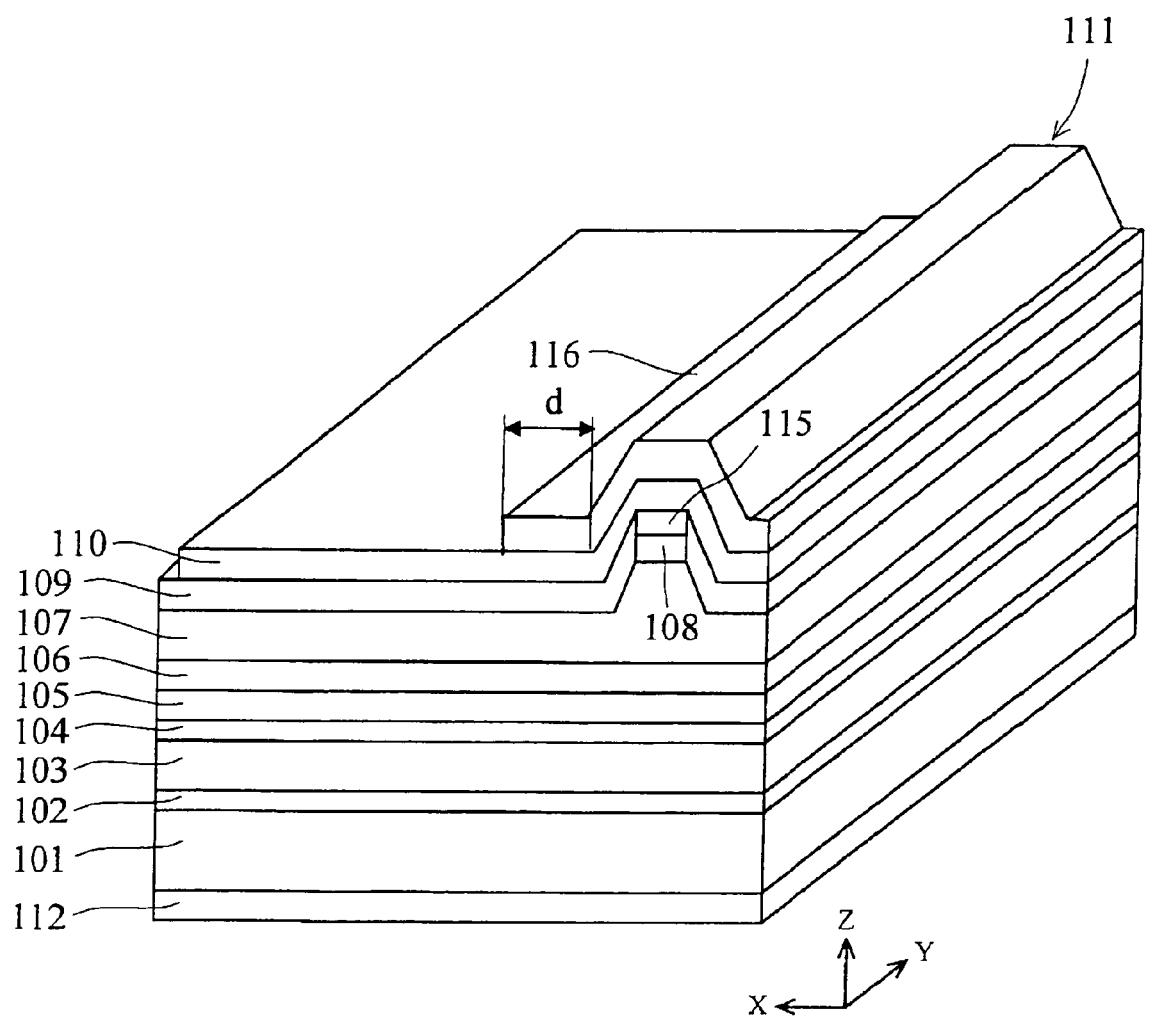
FIG. 7 is a perspective view of a nitride semiconductor laser chip according to a seventh embodiment of the present invention.

Next, a seventh embodiment of the present invention will be described with reference to FIG. 7. FIG. 7 is a perspective view of the nitride semiconductor laser chip according to the seventh embodiment of the present invention. According to the seventh embodiment of the present invention, a protection film 116 is formed on the entire ridge stripe part 111 and a part of the upper surface of the p-type electrode pad 110 at the vicinity of the ridge stripe part 111 as shown in FIG. 7.

The aging test of the nitride semiconductor laser device according to the seventh embodiment was performed similarly to the first embodiment. As a result, the voltage rise due to the aging was not found also in the nitride semiconductor laser device of the seventh embodiment, and it was confirmed that the nitride semiconductor laser device can work stably for a long period of time. From this result, it is considered that the voltage rise due to the aging can be suppressed so as to obtain a stable operation for a long period of time if the protection film covers at least the ridge stripe part 111. In addition, it is preferable that the protection film 116 formed on the upper surface of the p-type electrode pad 110 should be formed so that a distance (d) between the edge of the ridge stripe part 111 and the edge of the protection film 116 is 3 microns or larger. If the protection film 116 is formed in this way, the nitride semiconductor laser device of the seventh embodiment can be operated stably for a long period of time. Note that the structure of the seventh embodiment is the same as the first embodiment except for that the structure of the protection film 116 is different from the structure of the protection film 113. In addition, the layer structure of the protection film 116 can be the same as that of the protection films 113 and 113b to 113f.

Eighth Embodiment

Figure 8:
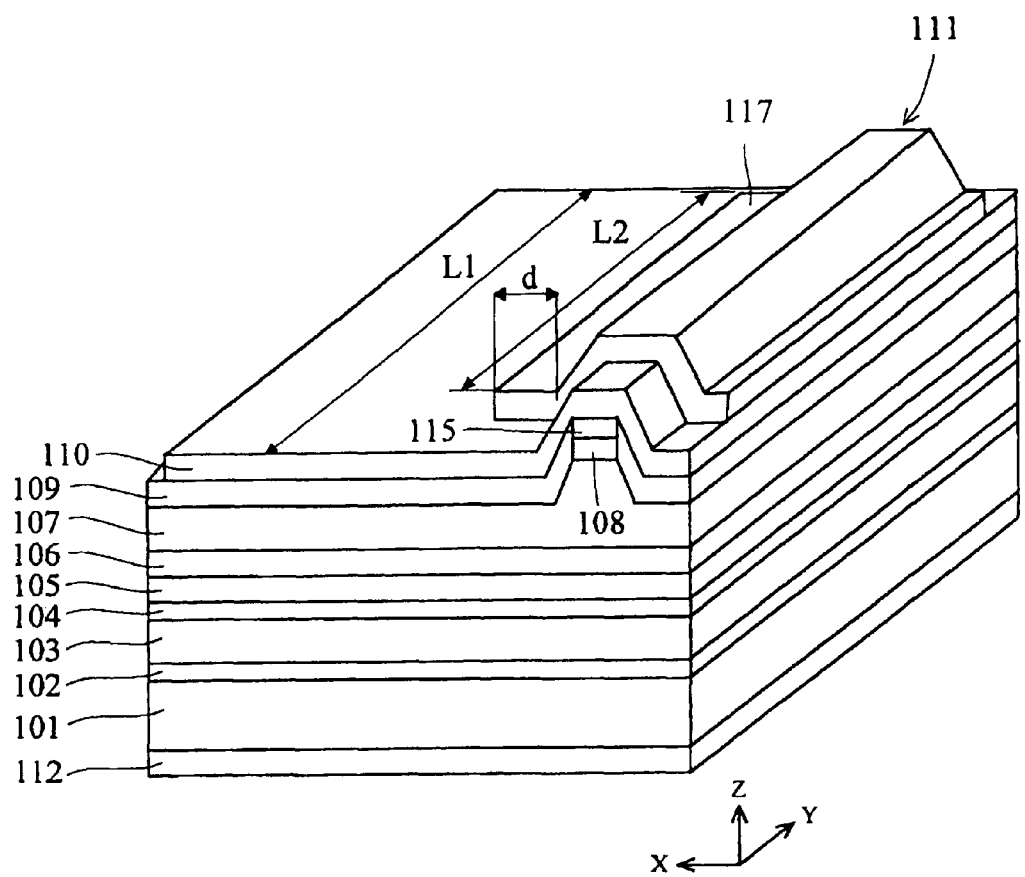
FIG. 8 is a perspective view of a nitride semiconductor laser chip according to an eighth embodiment of the present invention.

Next, an eighth embodiment of the present invention will be described with reference to FIG. 8. FIG. 8 is a perspective view of the nitride semiconductor laser chip according to the eighth embodiment of the present invention. According to the eighth embodiment of the present invention, a protection film 117 is formed so as to cover a part of the ridge stripe part 111 as the current injection region and a part of the upper surface of the p-type electrode pad 110 as shown in FIG. 8. In other words, the protection film 117 is formed so that the length (L2) in the resonator direction (Y direction) is shorter than a resonator length (L1) (a length of the ridge stripe part 111 in the resonator direction) as shown in FIG. 8.

In the eighth embodiment, the aging test of the nitride semiconductor laser device in which the length (L2) of the protection film 117 in the resonator direction (Y direction) was changed was performed similarly to the first embodiment. As a result, the voltage rise due to the aging was not found under the condition of L2/L1≥0.3, and it was confirmed that the nitride semiconductor laser device can work stably for a long period of time. In addition, the effect thereof became larger as the value of L2/L1 was closer to 1. From this result, the effect of suppressing the voltage rise due to the aging can be obtained if at least 30% or more of the ridge stripe part 111 is covered with the protection film above the ridge stripe part 111 as the current injection region. Note that a distance (d) between the edge of the ridge stripe part 111 and the edge of the protection film 117 is preferably 3 microns or larger. In addition, the structure of the eighth embodiment is the same as the first embodiment except for that the structure of the protection film 117 is different from the structure of the protection film 113. In addition, the layer structure of the protection film 117 can be the same as that of the protection films 113 and 113b to 113f.

Note that each the embodiments described above is merely an example and should not be interpreted in a limiting manner. The scope of the present invention should be defined not by the above description but by the attached claims, which is intended to include equivalent meaning and scope thereof and all modifications within the scope.

For example, although the nitride semiconductor laser device is exemplified as the nitride semiconductor light emitting device in the descriptions of the first to the eighth embodiments, the present invention is not limited to this structure. The nitride semiconductor light emitting device can be a nitride semiconductor light emitting diode or the like. In addition, although the ridge stripe type nitride semiconductor laser device is exemplified as the nitride semiconductor laser device in the descriptions of the first to the eighth embodiments, the present invention is not limited to this structure. The nitride semiconductor laser device can be a surface light emitting nitride semiconductor laser device or the like. Note that the p-type nitride semiconductor layer region under the light transparent electrode is referred to as the current injection region while a light emitting surface is the light emitting region in the surface light emitting nitride semiconductor laser device and the nitride semiconductor light emitting diode.

In addition, although the GaN substrate is exemplified as the nitride semiconductor substrate in the descriptions of the first to the eighth embodiments described above, the present invention is not limited to this structure. The nitride semiconductor substrate can be an AlGaN substrate, an AlN substrate or the like.

In addition, although the structure in which the protection film is formed above the current injection region is exemplified in the descriptions of the first to the eighth embodiments described above, the present invention is not limited to this structure. It is possible to adopt another structure in which the protection film is formed above the p-type nitride semiconductor layer. In this structure too, it is possible to prevent the hydrogen molecules contained in moisture in atmospheric air from reaching the p-type nitride semiconductor layer when the nitride semiconductor light emitting device is operated in the atmospheric air. Thus, it is possible to prevent the hydrogen molecules from penetrating the p-type nitride semiconductor layer and being diffused by the same so as to suppress the voltage rise of the nitride semiconductor light emitting device since the p-type nitride semiconductor layer becomes the nitrogen content) in each layer of the silicon nitride oxide films may be different from each other in the thickness direction of the protection film, i.e., in the laminating direction of the nitride semiconductor layers, and the oxygen content (or the nitrogen content) in the layers may be changed step by step. As the protection film for the present invention, from viewpoints of adhesiveness with the electrode and stress, protection films as shown in Table 1 can be used, for example. The effect similar to that described above can be obtained in any one of the layered protection films shown in Table 1.

TABLE 1

| No. | First Layer close to nitride semiconductor layer | | Second layer formed on upper surface of first layer | | Third layer formed on upper surface of second layer | |
|---|---|---|---|---|---|---|
| | Type of film | thickness/nm | Type of film | thickness/nm | Type of film | thickness/nm |
| 1 | silicon nitride | 80 | silicon oxide | 20 | — | |
| 2 | silicon nitride | 400 | — | | — | |
| 3 | silicon nitride oxide | 500 | — | | — | |
| 4 | silicon nitride oxide | 140 | silicon oxide | 80 | — | |
| 5 | silicon oxide | 20 | silicon nitride | 80 | silicon oxide | 20 |
| 6 | silicon oxide | 20 | silicon nitride | 400 | — | |
| 7 | silicon oxide | 20 | silicon nitride oxide | 500 | — | |
| 8 | silicon oxide | 20 | silicon nitride oxide | 140 | silicon oxide | 80 |
| 9 | zirconium oxide | 25 | silicon nitride | 20 | silicon oxide | 20 |
| 10 | titanium oxide | 20 | silicon nitride | 100 | — | |
| 11 | titanium oxide | 20 | silicon nitride oxide | 200 | — | |
| 12 | titanium oxide | 5 | silicon nitride | 120 | aluminium oxide | 40 | to have a high resistance. Thus, the nitride semiconductor light emitting device can work stably for a long period of time. Note that the protection film formed above the p-type nitride semiconductor layer may have the same structure as the protection film of the first to the eighth embodiments.

In addition, although the silicon nitride oxide film ($SiO_{1-x}N_x$) constituting the protection film exemplified in the above description of the second and the third embodiment has the structure where the composition ratio of nitrogen x is 0.6 or 0.8, the present invention is not limited to this structure. The composition ratio of nitrogen x in the silicon nitride oxide film ($SiO_{1-x}N_x$) is sufficient if it satisfied the condition of $0<x\leq1$, preferably $0.1\leq x\leq1$, and more preferably $0.4\leq x\leq1$. Furthermore, although the Auger analysis (AES) is exemplified as the method of measuring nitrogen content in the above description, the method may be an EDX analyze (Energy Dispersive fluorescent X-rays analyze) using a TEM (Transmission Electron beam diffraction Microscope) or the like. Note that the nitrogen composition ratio x in the silicon nitride oxide film of the present invention means a value determined from a ratio between the oxygen content and the nitrogen content without including argon or impurities contained in the sputter film when the silicon nitride oxide film is formed.

The protection film used in the present invention is not limited to the protection film described in the first to the eighth embodiments described above, and it may have a multilayered structure in which the silicon nitride films or the silicon nitride oxide films are laminated. In addition, it may have a multilayered structure in which the silicon nitride film and the silicon nitride oxide film are laminated. Furthermore, when the silicon nitride oxide films are laminated so that the multilayered protection film is formed, the oxygen content (or In addition, the protection film that is used for the present invention may include the insulator film such as the silicon oxide film or the like as described above in the first and the third to the fifth embodiments, or may not includes the insulator film such as the silicon oxide film or the like as described in the second and the sixth embodiments. Other than the silicon oxide, it is possible to use titanium oxide, silicon oxide, niobium oxide, tantalum oxide, zirconium oxide or the like.

The protection film that is used for the present invention is more preferable to be a silicon nitride film than a silicon nitride oxide film. For example, if the silicon nitride film and the silicon nitride oxide film to be used have the same thickness, the effect of suppressing the voltage rise is larger as the nitrogen content is larger. In other words, the larger the nitrogen content in the silicon nitride film is, the larger the effect of suppressing the voltage rise. Therefore, the silicon nitride film can obtain the same effect as the silicon nitride oxide film by the thickness thinner than that of the silicon nitride oxide film.

In addition, at least one or more types of additives selected from a group consisting of aluminium (Al), zirconium (Zr), hafnium (Hf), tantalum (Ta), niobium (Nb), titanium (Ti), gallium (Ga), vanadium (V), yttrium (Y) and the like may be doped into the silicon nitride film or the silicon nitride oxide film that is used for the present invention. In this case, it is preferable that a doping ratio of the additives should be 10% or smaller of the silicon nitride film or the silicon nitride oxide film.

In addition, although the electrode pad made of molybdenum (Mo) and gold (Au), the p-type electrode made of palladium (Pd), and the n-type electrode made of hafnium (Hf), aluminium (Al), molybdenum (Mo), platinum (Pt) and gold (Au) are exemplified in the above descriptions of the first to the eighth embodiments, the present invention is not limited to this structure, the electrode pad and the electrode may be made of a metal material such as nickel (Ni), palladium (Pd), gold (Au), platinum (Pt), molybdenum (Mo), aluminium (Al), hafnium (Hf) and the like.

In addition, the insulating film made of the silicon oxide and the titanium oxide is exemplified as the insulating film formed on the upper surface of the nitride semiconductor layer in the above descriptions of the first to the eighth embodiments, the present invention is not limited to this structure. The insulating film may be made of an insulator material such as an aluminium oxide, a titanium oxide, a silicon oxide, a niobium oxide, a tantalum oxide, a zirconium oxide or the like.

In addition, the aging test is performed in the state without the cap in the first to the eighth embodiments described above, it is possible to attach a cap without a lens to the holding substrate by press fitting in advance for protecting wires so that the wires are prevented from being deteriorated by the aging.

What is claimed is:

1. A nitride semiconductor light emitting device comprising:
    a nitride semiconductor substrate; and
    a nitride semiconductor layer having a p-type nitride semiconductor layer formed on the nitride semiconductor substrate, wherein
    the nitride semiconductor layer has a ridge stripe part on a top face thereof,
    the ridge stripe part has a current injection region into which current is injected,
    an electrode is formed over the ridge stripe part,
    an electrode pad is formed on the top face of the nitride semiconductor layer at least over the ridge stripe part and a part adjacent thereto, the electrode pad being in contact with the electrode,
    a protection film is formed to cover at least a part of the electrode pad located over the ridge stripe part and the part adjacent thereto, a part of the protection film not located over the ridge stripe part being so formed as to be partially exposed to external conditions, and
    the protection film is made up of a silicon nitride film and/or a silicon nitride oxide film.

2. The nitride semiconductor light emitting device according to claim 1, wherein a thickness of the silicon nitride film or the silicon nitride oxide film is 6 nanometers or larger.

3. The nitride semiconductor light emitting device according to claim 1, wherein the silicon nitride oxide film is expressed by a general formula $SiO_{1-x}N_x$, and a composition ratio of nitrogen x in the silicon nitride oxide film is 0.1 or more.

4. The nitride semiconductor light emitting device according to claim 1, wherein the protection film is not disposed on sidewalls of the nitride semiconductor layer.

5. The nitride semiconductor light emitting device according to claim 1, wherein the nitride semiconductor layer further includes an active layer, and the protection film is not disposed below the active layer.

6. The nitride semiconductor light emitting device according to claim 1, wherein the electrode pad is between an uppermost surface of the electrode and the protection film.

7. The nitride semiconductor light emitting device according to claim 1, wherein the electrode does not directly contact the protection film.

8. The nitride semiconductor light emitting device according to claim 1, wherein the electrode pad is between a side surface of the electrode and the protection film.

9. The nitride semiconductor light emitting device according to claim 1, wherein an area of the upper surface of the electrode pad is greater than an upper surface area of the protection film.

10. The nitride semiconductor light emitting device according to claim 1, wherein the protection film exposes a portion of the electrode pad adjacent to the ridge stripe part.

* * * * *